US008354327B2

(12) United States Patent
Zengxiang et al.

(10) Patent No.: US 8,354,327 B2
(45) Date of Patent: Jan. 15, 2013

(54) SCHEME FOR PLANARIZING THROUGH-SILICON VIAS

(75) Inventors: Chen Zengxiang, Singapore (SG); Zhao Feng, Shanghai (CN); Liu Huang, Singapore (SG); Yuan Shaoning, Singapore (SG)

(73) Assignee: GLOBALFOUNDRIES Singapore Pte Ltd, Singapore (SG)

( * ) Notice: Subject to any disclaimer, the term of this patent is extended or adjusted under 35 U.S.C. 154(b) by 0 days.

(21) Appl. No.: 13/091,473

(22) Filed: Apr. 21, 2011

(65) Prior Publication Data
US 2012/0270391 A1 Oct. 25, 2012

(51) Int. Cl.
H01L 21/76 (2006.01)
(52) U.S. Cl. ...................................................... 438/429
(58) Field of Classification Search .................. 438/429, 438/432
See application file for complete search history.

(56) References Cited

U.S. PATENT DOCUMENTS 6,322,600 B1 * 11/2001 Brewer et al. ............... 51/308
6,562,712 B2 * 5/2003 Liu et al. ...................... 438/631
2001/0035578 A1 * 11/2001 Liang et al. .................. 257/706

OTHER PUBLICATIONS

Mercha et al., "Comprehensive Analysis of the Impact of Single and Arrays of Through Silicon Vias Induced Stress on High-K/Metal Gate CMOS Perfoemance".;978-1-4244-7419-6/10, 2010 IEEE.*
Mercha et al., "Comprehensive Analysis of the Impact of Single and Arrays of Through Silicon Vias Induced Stress on High-k/Metal Gate CMOS Performance," IEEE, IEDM10-26-29, 2010.
Motoyoshi, "Through-Silicon Via (TSV)," *Proceedings of the IEEE*, 97:43-48, 2009.
Olmen et al., "3D Stacked IC Demonstration Using a Through Silicon Via First Approach," IEEE, pp. 603-606, 2008.
Pozder et al., "Progress of 3D Integration Technologies and 3D Interconnects," IEEE, pp. 213-215, 2007.
The et al., "Magnetically-enhanced capacitively-coupled plasma etching for 300 mm wafer-scale fabrication of Cu through-silicon-vias for 3D logic integration," IEEE, pp. 53-55, 2009.
Inoue et al., "Study of Low Resistance TSV Using Electroless Plated Copper and Tungsten-alloy Barrier," IEEE, pp. 167-168, 2009.

* cited by examiner

*Primary Examiner* — Charles Garber
*Assistant Examiner* — Andre' C Stevenson
(74) *Attorney, Agent, or Firm* — Williams, Morgan & Amerson, P.C.

(57) ABSTRACT

Generally, the subject matter disclosed herein relates to conductive via elements, such as through-silicon vias (TSV's), and methods for forming the same. One illustrative method disclosed herein includes forming a layer of isolation material above a via opening formed in a semiconductor device, the via opening extending into a substrate of the semiconductor device. The method also includes performing a first planarization process to remove at least an upper portion of the layer of isolation material formed outside of the via opening, and forming a conductive via element inside of the via opening after performing the first planarization process.

24 Claims, 7 Drawing Sheets

SCHEME FOR PLANARIZING THROUGH-SILICON VIAS

BACKGROUND

1. Field of the Disclosure

Generally, the present disclosure relates to sophisticated integrated circuits, and, more particularly, to structures and manufacturing methods for forming through-silicon vias.

2. Description of the Related Art

In recent years, the device features of modern, ultra-high density integrated circuits have been steadily decreasing in size in an effort to enhance the overall speed, performance, and functionality of the circuit. As a result, the semiconductor industry has experience tremendous growth due to the significant and ongoing improvements in integration density of a variety of electronic components, such as transistors, capacitors, diodes, and the like. These improvements have primarily come about due to a persistent and successful effort to reduce the critical dimension—i.e., minimum feature size—of components, directly resulting in the ability of process designers to integrate more and more components into a given area of a semiconductor chip.

Improvements in integrated circuit design have been essentially two-dimensional (2D)—that is, the improvements have been related primarily to the layout of the circuit on the surface of a semiconductor chip. However, as device features are being aggressively scaled, and more semiconductor components are being fit onto the surface of a single chip, the required number of electrical interconnects necessary for circuit functionality dramatically increases, resulting in an overall circuit layout that is increasingly becoming more complex and more densely packed. Furthermore, even though improvements in photolithography processes have yielded significant increases in the integration densities of 2D circuit designs, simple reduction in feature size is rapidly approaching the limit of what can presently be achieved in only two dimensions.

As the number of electronic devices on single chip rapidly increases, three-dimensional (3D) integrated circuit layouts, or stacked chip design, have been utilized for some semiconductor devices in an effort to overcome some of the feature size and density limitations associated with 2D layouts. Typically, in a 3D integrated circuit design, two or more semiconductor dies are bonded together, and electrical connections are formed between each die. One method of facilitating the chip-to-chip electrical connections is by use of so-called through-silicon vias, or TSV's. A TSV is a vertical electrical connection that passes completely through a silicon wafer or die, allowing for more simplified interconnection of vertically aligned electronic devices, thereby significantly reducing integrated circuit layout complexity as well as the overall dimensions of a multi-chip circuit. Some of the benefits associated with the interconnect technology enabled by 3D integrated circuit designs include accelerated data exchange, reduced power consumption, and much higher input/output voltage densities.

Through-silicon vias can be integrated into virtually any phase of semiconductor device manufacturing, including via-first, via-middle, and via-last schemes. Currently, most integration development has tended to focus on forming TSV's within an active area of the semiconductor die—e.g., via-middle and via-last schemes. A typical prior art process for forming TSV's based on a via-middle scheme, wherein the TSV's are formed after transistor and contact element formation, is illustrated in FIGS. 1a-1f, and will now be discussed in detail below.

FIG. 1a is a schematic cross-sectional view depicting one stage in a via-middle integration scheme used in the formation of a TSV in accordance with an illustrative prior art process. As shown in FIG. 1a, a semiconductor chip or wafer 100 may comprise a substrate 101, which may represent any appropriate carrier material above which may be formed a semiconductor layer 102. Additionally, a plurality of schematically depicted active and/or passive circuit elements 103, such as transistors, capacitors, resistors and the like, may be formed in and above the semiconductor layer 102, in which case the semiconductor layer 102 may also be referred to as a device layer 102. Depending on the overall design strategy of the wafer 100, the substrate 101 may in some embodiments be comprised of a substantially crystalline substrate material (i.e., bulk silicon), whereas in other embodiments the substrate 101 may be formed on the basis of a silicon-on-insulator (SOI) architecture, in which a buried insulating layer 101a may be provided below the device layer 102. It should be appreciated that the semiconductor/device layer 102, even if comprising a substantially silicon-based material layer, may include other semiconducting materials, such as germanium, carbon and the like, in addition to appropriate dopant species for establishing the requisite active region conductivity type for the circuit elements 103.

FIG. 1a also illustrates a contact structure layer 104, which may be formed above the device layer 102 so as to provide electrical interconnects between the circuit elements 103 and a metallization system (not shown) to be formed above the device layer 102 during subsequent processing steps. For example, one or more interlayer dielectric (ILD) layers 104a may be formed above the device layer 102 so as to electrically isolate the respective circuit elements 103. The ILD layer 104a may comprise, for example, silicon dioxide, silicon nitride, silicon oxynitride, and the like, or a combination of these commonly used dielectric materials. Furthermore, depending on the device design and overall process flow requirements, the interlayer dielectric layer 104a may also comprise suitably selected low-k dielectric materials, such as porous silicon dioxide, organosilicates, organic polyimides, and the like. Thereafter, the ILD layer 104a may be patterned to form a plurality of via openings, each of which may be filled with a suitable conductive material such as tungsten, copper, nickel, silver, cobalt and the like (as well as alloys thereof), thereby forming contact vias 105. Additionally, in some embodiments, one or more trench openings may also be formed in the ILD layer 104a above one or more of the vias openings noted above. Thereafter, depending on the specified processing parameters, any trenches formed in the ILD layer 104a may be filled in a common deposition step with a similar conductive material such as noted for the contact vias 105 above, thereby forming conductive lines 106 as may be required by the device requirements.

As shown in FIG. 1a, in certain embodiments, a hardmask layer 107, which may act as a stop layer for a subsequently performed chemical-mechanical polishing (CMP) process, may thereafter be formed above the contact structure layer 104. The hardmask layer 107 may comprise a dielectric material having an etch selectivity relative to at least the material comprising the upper surface portion of the ILD layer 104a, such as silicon nitride (SiN), silicon oxynitride (SiON), silicon carbide (SiC), silicon carbonitride (SiCN) and the like. In some illustrative embodiments, the hardmask layer 107 may be formed above the contact structure layer 104 by performing a suitable deposition processes based on parameters well known in the art, such as a chemical vapor deposition (CVD) process, a physical vapor deposition (PVD) process, atomic layer deposition (ALD), spin on coating, and the like. Thereafter, a patterned resist mask layer 108 may be formed above the hardmask layer 107 based on typical photolithography processes, such as exposure, baking, developing, and the like, so as to provide openings 108a in the mask layer 108, thereby exposing the hardmask layer 107.

FIG. 1b shows the illustrative prior art process of FIG. 1a in a further manufacturing stage, wherein an etch process 109 is performed to create TSV openings 110 in the wafer 100. As shown in FIG. 1b, the patterned resist mask layer 108 may be used as an etch mask during the etch process 109 to form openings in the hardmask layer 107, and to expose the ILD layer 104a of the contact structure layer 104. Thereafter, the etch process 109 may be continued, and the patterned mask layer 108 and patterned hardmask layer 107 may be used as mask elements to form the TSV openings 110 through the contact structure layer 104, through the device layer 102, and into the substrate 101. In certain embodiments, the etch process 109 may be a substantially anisotropic etch process, such as a deep reactive ion etch (REI), and the like. Depending on the chip design considerations and etch parameters employed during the etch process 109, the sidewalls 110s of the TSV openings 110 may be substantially vertical with respect to the front and back surfaces 100f, 100b of the wafer 100 (as shown in FIG. 1b), whereas in some embodiments the sidewalls 110s may be slightly tapered, depending on the depth of the TSV openings 110 and the specific etch recipe used to perform the etch process 109. Moreover, since the TSV openings 110 may pass through and/or into a plurality of different material layers, such as the ILD layer 104a, the device layer 102, a buried insulation layer 101a (when used), and the substrate 101, the etch process 109 may be substantially non-selective with respect to material type, such that a single etch recipe may be used throughout the duration of the etch In other illustrative embodiments, however, the etch process 109 may comprise a plurality of different etch recipes, each of which may be substantially selective to the material layer being etched.

Depending on the overall processing and chip design parameters, the openings 110 may have a width dimension 110w ranging from 1-10 µm, a depth dimension 110d ranging from 5-50 µm or even more, and an aspect ratio—i.e., depth-to-width ratio—ranging between 4 and 25. In one embodiment, the width dimension 110w may be approximately 5 µm, the depth dimension 110d may be approximately 50 µm, and the aspect ratio may be approximately 10. Typically, however, and as shown in FIG. 1b, the TSV openings 110 do not, at this stage of fabrication, extend through the full thickness of the substrate 101, but instead stop short of the back surface 100b of the wafer 100. For example, in some embodiments, the etch process 109 is continued until the bottom surfaces 110b of the TSV openings 110 come within a range of approximately 1-20 µm of the back surface 100b. Additionally, and as will be discussed in further detail below, after the completion of processing activities above the front side 100f of the wafer 100, such as processing steps to form a metallization system above the contact structure layer 104 and the like, the wafer 100 is thinned from the back side 100b so as to expose the finished TSV's 120 (see FIG. 1f).

FIG. 1c shows a further advanced step of the illustrative prior art method illustrated in FIG. 1b after the patterned resist mask layer 108 has been removed from above the hardmask layer 107. Depending on the overall chip configuration and design considerations, an isolation layer 111 may be formed on or adjacent to the exposed surfaces of the TSV openings 100 so as to eventually electrically isolate the finished TSV's 120 (see FIG. 1f) from the substrate 101, the device layer 102, and/or the contract structure layer 104. As shown in FIG. 1c, the isolation layer 111 may be formed above all exposed surfaces of the wafer 100, including the upper surface 107u of the hardmask layer 107, and the sidewall and bottom surfaces 110s, 110b of the TSV openings 110. It should be noted that, depending on the overall device requirements and processing scheme, an intervening material layer (not shown), such as an adhesion layer or barrier layer, and the like, may be deposited between the isolation layer 111 and the surfaces 110s, 110b. In certain embodiments, the isolation layer 111 may be formed by performing a suitable conformal deposition process 131 designed to deposit an appropriate dielectric insulating material layer having a substantially uniform thickness on the exposed surfaces of the TSV openings 110. It should be noted, however, that the as-deposited thickness of the isolation layer 111 may vary to a greater or lesser degree, depending on the specific location and the orientation of the surface onto which it is deposited, as will be further discussed below.

For example, in some embodiments, the isolation layer 111 may be formed of silicon dioxide, and the deposition process 131 may be any one of several deposition techniques well known in the art, such as low-pressure chemical vapor deposition (LPCVD), sub-atmospheric-pressure chemical vapor deposition (SACVD), plasma-enhanced chemical vapor deposition (PECVD), and the like. In certain embodiments, the isolation layer 111 may comprise silicon dioxide, and may be deposited based on tetraethylorthosilicate (TEOS) and $O_3$ (ozone) using LPCVD, SACVD or PECVD processes. Additionally, the minimum required as-deposited thickness of the isolation layer 111 may be established as necessary to ensure that the TSV 120 (see FIG. 1f) is electrically isolated from the surrounding layers of the wafer 100. For example, in order to ensure proper surface coverage and layer functionality, the minimum required thickness of the isolation layer 111 at any point within the TSV openings 110 may be on the order of approximately 100-200 nm, whereas in specific embodiments the minimum thickness may be approximately 150 nm. However, as noted previously, even though a substantially conformal deposition process may be used to form the isolation layer 111, the as-deposited thickness of the isolation layer 111 may vary to a greater or lesser degree, depending on the specific location and orientation of the surface where the isolation layer 111 may be deposited.

For example, the as-deposited thickness of the isolation layer 111 may vary from a thickness 111t above the upper surface 107u of the hardmask layer 107, to a thickness 111U near the upper portion of the TSV sidewall 110s, to a thickness 111L near the lower portion of the TSV sidewall 110s, to a thickness 111b at the bottom surface 110b of the TSV opening 110. Furthermore, depending on the type of deposition process utilized and the coverage efficiency obtained, the as-deposited thicknesses 111t, 111U, 111L and 111b may vary from greatest to least by a factor of 2, 3, 4 or even more. For example, when a 50% coverage efficiency is obtained when depositing the isolation layer 111, the least as-deposited thickness may be approximately 50% of the greatest as-deposited thickness—i.e., varying by a factor of 2. Similarly, when the coverage efficiency is 33%, the greatest and least as-deposited thickness may vary by a factor of approximately 3, and when the coverage efficiency is 25% or less, the as-deposited thicknesses of the isolation layer 111 may vary by a factor of approximately 4 or more.

Table 1 below lists some exemplary as-deposited thicknesses of the isolation layer 111 when deposited using PECVD based on TEOS. The process designations listed in Table 1 are generally indicative of varying process parameters, as well as a targeted nominal thickness in angstroms of the material deposited above the upper surface 107u of the hardmask layer 107. As can be seen from the thickness data presented in Table 1, in order to obtain a minimum as-deposited thickness on the sidewalls 110s of the TSV openings 110 of approximately 150-200 nm, the as-deposited thickness above the upper surface 107u of the hardmask layer 107 may be on the order of approximately 700 nm or more, resulting in a coverage efficiency of around 25-30%. Furthermore, as will be discussed in greater detail below, the substantially increased thickness 111t of the layer 111 above the upper surface 107u of the hardmask layer 107 may, in some instances, result in processing difficulties during subsequently performed CMP steps adapted for planarizing the wafer 100 after deposition of the conductive material used to form the finished TSV's 120 (see FIG. 1f).

TABLE 1

As-Deposited Isolation Layer Thicknesses

| | As-Deposited Thicknesses (nm) | | | |
|---|---|---|---|---|
| Process | 111t | 111U | 111L | 111b |
| 4k | 350 | 140-180 | 60-120 | 60 |
| 6k | 612 | 260-300 | 115-130 | 108 |
| 8k | 720 | 320-350 | 150-200 | 130 |
| 16k | 1600 | 250-300 | 140-230 | 260 |

FIG. 1d depicts the illustrative prior art method of FIG. 1c after a barrier layer 112 has been formed above the wafer 100. In some embodiments, the barrier layer 112 may serve to prevent the conductive material comprising the finished TSV's 120 (see FIG. 1f) from diffusing into and/or through the isolation layer 111, or into and/or through the ILD layer 104a, a situation that could significantly affect the overall performance of the circuit elements 103, the contact vias 105, and/or the conductive lines 106. Furthermore, the barrier layer 112 may also act as an adhesion layer, thereby potentially enhancing that overall bond between the contact material of the finished TSV's 120 and the underlying dielectric isolation layer 111.

As shown in FIG. 1d, the barrier layer 112 may be formed above all exposed surfaces of the isolation layer 111, including the exposed surfaces inside of the TSV openings 110. In certain illustrative embodiments, the barrier layer 112 may be deposited above the isolation layer 111 by performing a substantially conformal deposition process 132, such as CVD, PVD, ALD (atomic layer deposition) and the like. Depending on device requirements and TSV design parameters, the barrier layer 112 may comprise any one of a number of suitable barrier layer materials well known in the art to reduce and/or resist the diffusion of metal into a surrounding dielectric, such as tantalum (Ta), tantalum nitride (TaN), titanium (Ti), titanium nitride (TiN), titanium silicon nitride (TiSiN), tungsten nitride (WN), and the like. Furthermore, due to the relatively large width 110w of the TSV openings 110 as compared to a contact via used to form an electrical interconnection to a typical integrated circuit element—such as the contact vias 105—the thickness of the barrier layer 112 may not be critical to the overall performance characteristics of the TSV's 120 (see FIG. 1f). Accordingly, the thickness of the barrier layer 112 may in some illustrative embodiments range between 40 nm and 200 nm, depending on the material type and deposition method used to form the barrier layer 112, whereas in specific embodiments, the thickness of the barrier layer 112 may range from 50-100 nm.

After the barrier layer 112 has been formed above the exposed surfaces of the isolation layer 111, a layer of conductive contact material 113 may then be formed above the wafer 100 so as to completely fill the TSV openings 110, as shown in FIG. 1e. Depending on the TSV design requirements, the layer of conductive contact material 113 may be substantially comprised of a conductive metal such copper, and the like, or in certain embodiments may comprise a suitable copper metal alloy. In some embodiments, the TSV openings 110 may be filled with the layer of conductive contact material 113 based on a substantially "bottom-up" deposition process 133 well known to those skilled in the art, such as a suitably designed electrochemical plating (ECP) process and the like, thereby reducing the likelihood that voids may be formed and/or trapped in the finished TSV's 120 (see FIG. 1f). In other illustrative embodiments, an electroless plating process may be employed. Additionally, and depending on the type of material used for the barrier layer 112 and the type of deposition process 133 used to fill the TSV openings 110, a seed layer (not shown) may be formed on the barrier layer 112 prior to performing the deposition process 133. In certain embodiments, the optional seed layer may be deposited using a highly conformal deposition process, such as sputter deposition, ALD, and the like, and may have a thickness ranging from approximately 5-10 nm. However, in other illustrative embodiments, the thickness of the barrier layer 133 may be even greater—for example, from 10-15 nm—whereas in still other embodiments, the thickness may be even less—for example, from 1-5 nm. Depending on the processing requirements, still other barrier layer thicknesses may be used.

It should be noted that, as a result of the "bottom-up" deposition process 133 used to fill the TSV openings 110 in some prior art processes, depressions 114 may sometimes be present in the layer of conductive contact material 113 above each of the TSV openings 110 after completion of the deposition process 133. Depending on the depth 114a of any depressions 114 that may be present, a significant amount of material "overburden" 113b, or additional thickness, may need to be deposited outside of the TSV openings 110 and above the upper horizontal surfaces 100s of the wafer 100 to ensure that the TSV openings 110 are completely filled with the layer of conductive contact material 113. In order to ensure that the depth 114a of the depressions 114 in the conductive contact material layer 113 does not encroach into the TSV openings 110, the overburden 113b may need to at least equal, if not exceed, the depth 114a. Depending on the width 110w, depth 110d, and aspect ratio of the TSV openings 110, the overburden 113b may, in some illustrative embodiments, be greater than 2 nm, and may range as high as 4-5 µm, or even greater. However, it should be noted that when such a large conductive contact layer overburden thickness is necessary in order to ensure complete filling of the TSV openings 110, the effectiveness of any subsequently performed planarization processes, such as CMP processes and the like, can be severely impacted. Moreover, when considered in conjunction with the increased thickness 211t of the isolation layer 211 above the upper surface 207u of the hardmask layer 207, the effectiveness of a planarization process may be further impacted, as will be discussed in more detail below.

In those process recipes wherein the layer of conductive contact material 113 comprises an electroplated copper and/or copper alloy, the wafer 100 shown in FIG. 1e may be exposed to a heat treatment process after the layer of conductive contact material 113 has been formed, so as to facilitate grain growth and stabilization of the copper film characteristics. For example, the heat treatment process may be an annealing process performed under atmospheric pressure conditions at a temperature ranging between 100° C. and 300° C., and for a time of 1 hour or less. Depending on the overall integration scheme and thermal budget of the wafer 100, other heat treatment recipes may also be employed.

FIG. 1f shows the illustrative prior art process depicted in FIG. 1e in a further advanced manufacturing stage. As shown in FIG. 1f, a planarization process 140, such as a CMP process and the like, may be performed to remove the horizontal portion of the layer of conductive contact material 113 formed outside of the TSV openings 110 from above the wafer 100. Furthermore, in some embodiments the horizontal portions of the isolation layer 111 formed above the wafer 100 and outside of the TSV openings 110 may also be removed during the planarization process 140. Moreover, the thickness of the hardmask layer 107, which as noted previously may act as a CMP stop layer, may also be reduced during the planarization process 140. After completion of the planarization process 140, additional processing of the front side 100f of the wafer 100 may be performed, such as forming metallization layers and the like above the TSV's 120 and the contact structure layer 104. Thereafter, the wafer 100 may be thinned from the back side 100b so as to reduce the thickness of the substrate 101 (indicated in FIG. 1f by dashed line 101t) and expose the bottom surfaces 120b of the TSV's 120 in preparation for wafer stacking and substrate bonding—i.e., 3D integrated circuit assembly.

As noted previously, the increased thicknesses of the isolation layer 111 and the layer of conductive contact material 113 having large amount of overburden 113b formed outside of the TSV openings 110 and above the upper surface 107u of the hardmask layer 107 may substantially impact the overall effectiveness of the planarization process 140. For example, during the initial stages of the planarization process 140, when the material being planarized may only be the conductive contact material 113, the planarization process 140 may be performed using parameters that are substantially selective to the composition of the conductive contact material 113, which may be, for example, copper or a copper alloy. Furthermore, considering that a large amount of overburden 113b may be deposited so as to ensure that the TSV openings 110 are completely filled, the parameters of the planarization process 140 may be adjusted so as to shorten the duration of the planarizing step, thereby resulting in a significant and aggressive removal of material. For example, an aggressive slurry chemistry that is highly selective to the material comprising the conductive contact material 113, such as copper, may be used during the initial stage of the planarization process 140 so as to reduce overall processing time. However, once the barrier layer 112 and/or isolation layer 111 is encountered during the planarization process 140, the aggressive parameters used to selectively planarize the conductive contact material 113 may be adjusted so that multiple materials having different planarizing characteristics—i.e., the conductive contact material 113, the barrier layer 112, and the isolation layer 111—may be planarized simultaneously. Accordingly, the slurry chemistry may be changed to a chemistry that is selective to, for example, the material comprising the barrier layer 112, but that is less selective to the other types of materials that may be encountered during this stage of the planarization process 140. In general, however, it should be noted that planarization will typically proceed at a significantly slower pace during this stage of the planarization process 140 than during the initial aggressive stage noted above, and as will be discussed in detail below.

It should be appreciated that the removal rates of the different materials exposed to the planarization process 140 during this stage of processing the wafer 100 may not be the same, or in some instances, may not even be similar. For example, the removal rate of materials such as copper and/or copper alloys and the like (which may comprise the conductive contact material 113), may be significantly lower than the removal rate of dielectric materials such silicon dioxide and the like (which may comprise the isolation layer 111) when both are exposed to a planarization process 140 based on a slurry chemistry that is selective to the material of the barrier layer 112 as described above. As such, the material of the isolation layer 111 may be planarized more quickly than the material of the layer of conductive contact material 113, thereby resulting in a substantially non-planar protruding region 115 above each finished TSV 120, as shown in FIG. 1f. In some embodiments, the height 115a of the protruding region 115 may exceed 100 nm or more, and under certain conditions—such as, for example, the presence and/or depth 114a of a depression 114, the specific CMP process recipe employed, the material removal rate differential, and the like—the height 115a may be as large as 300-500 nm, or even greater. Furthermore, the presence of the protruding region 115 in the finished TSV's 120 may translate into additional defects in the layers of a metallization system (not shown) subsequently formed above the TSV's 120 and the contact structure layer 104, such as voids, gaps, and/or additional protruding, non-planar regions, thereby potentially leading to decreased product yield and reduced product performance.

Accordingly, there is a need to implement new design strategies to address the manufacturing and performance issues associated with the typical methods used for forming TSV's. The present disclosure relates to methods for avoiding, or at least reducing, the effects of one or more of the problems identified above.

SUMMARY OF THE DISCLOSURE

The following presents a simplified summary of the present disclosure in order to provide a basic understanding of some aspects disclosed herein. This summary is not an exhaustive overview of the disclosure, nor is it intended to identify key or critical elements of the subject matter disclosed here. Its sole purpose is to present some concepts in a simplified form as a prelude to the more detailed description that is discussed later.

Generally, the subject matter disclosed herein relates to conductive via elements, such as through-silicon vias (TSV's), and methods for forming the same. One illustrative method disclosed herein includes forming a layer of isolation material above a via opening formed in a semiconductor device, the via opening extending into a substrate of the semiconductor device. The method also includes performing a first planarization process to remove at least an upper portion of the layer of isolation material formed outside of the via opening, and forming a conductive via element inside of the via opening after performing the first planarization process.

Also disclosed herein is a method that includes forming a hardmask layer above a contact structure layer formed above a device layer of a substrate, and forming an opening that extends through the hardmask layer, contact structure layer and device layer, and into the substrate. Furthermore, the method includes forming a layer of isolation material inside of the opening and above the hardmask layer, a performing a first chemical-mechanical polishing process to remove at least an upper portion of the layer of isolation material formed above the hardmask layer. Finally, the method also includes forming a layer of conductive contact material to fill the opening after performing the first chemical-mechanical polishing process.

BRIEF DESCRIPTION OF THE DRAWINGS

The disclosure may be understood by reference to the following description taken in conjunction with the accompanying drawings, in which like reference numerals identify like elements, and in which.

Figure 1A:
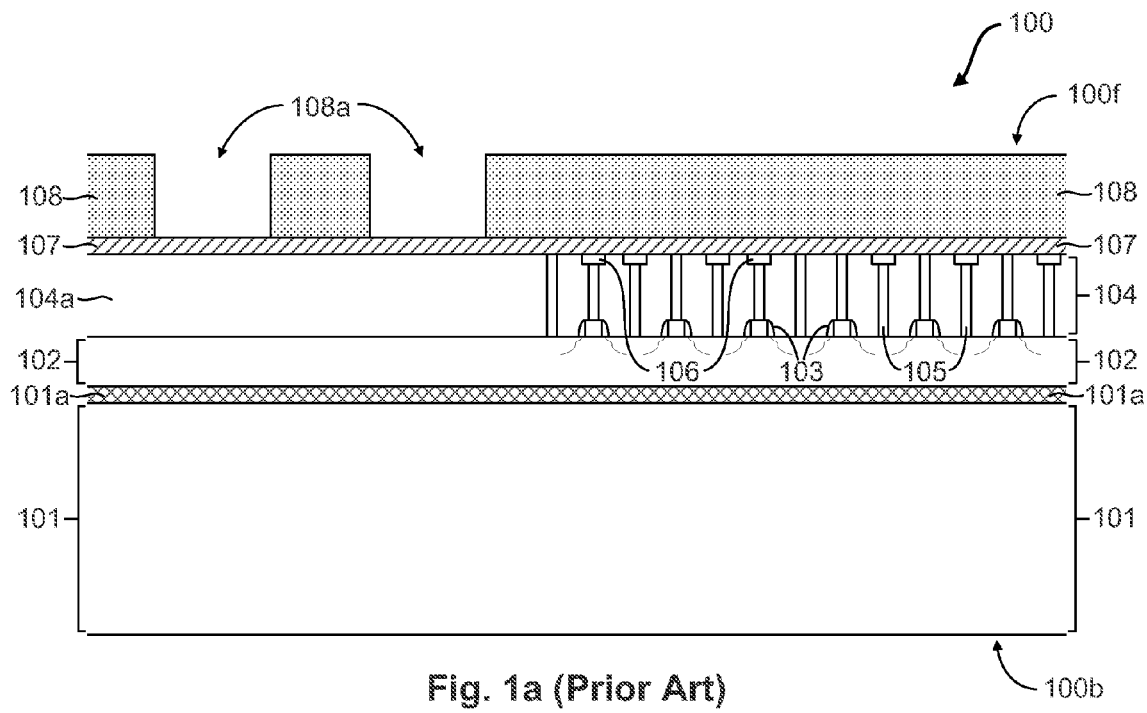
FIGS. 1a-1f schematically illustrate a process flow of an illustrative prior art method for forming TSV's in a semiconductor wafer.
Figure 1B:
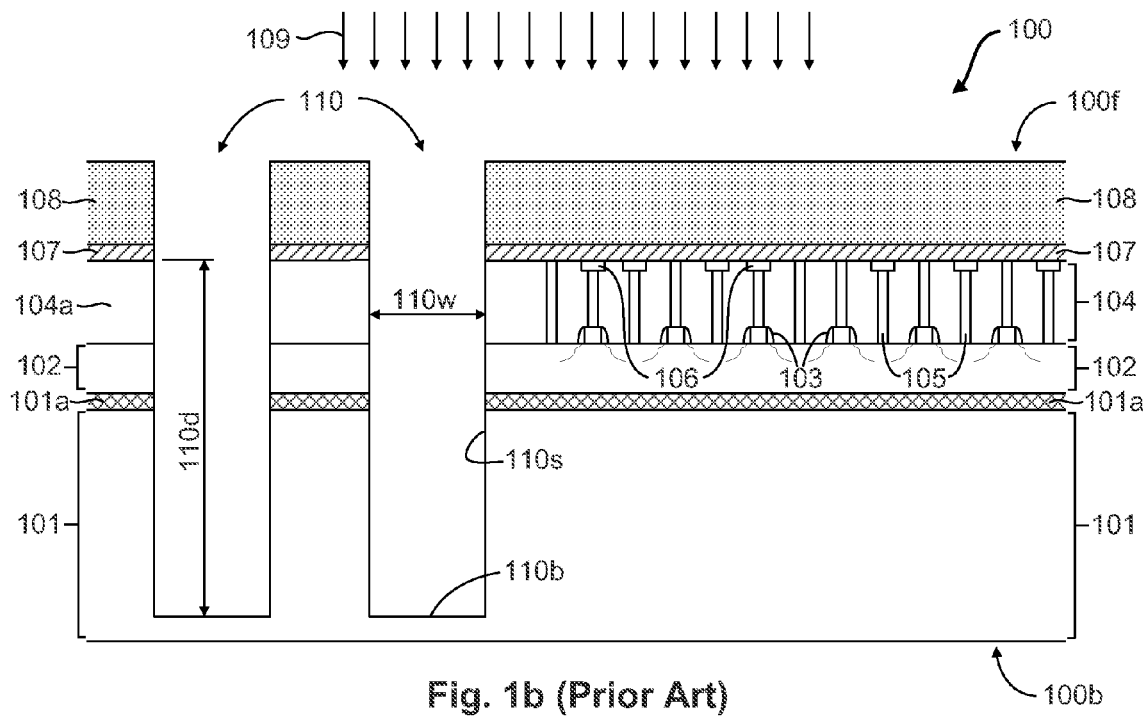

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides various embodiments of manufacturing techniques for planarizing through-silicon vias (TSV's) formed in a semiconductor wafer. It should be noted that, where appropriate, the reference numbers used in describing the various elements shown in the illustrative embodiments of FIGS. 2a-2e substantially correspond, where appropriate to the reference numbers used in describing related elements illustrated in FIGS. 1a-1f above, except that the leading numeral in each figure has been changed from a "1" to a "2." For example, wafer "100" corresponds to wafer "200," substrate "101" corresponds to substrate "201," device layer "102" corresponds to device layer "202," and so on. Accordingly, the reference number designations used to identify some elements of the presently disclosed subject matter may be illustrated in the FIGS. 2a-2e but may not be specifically described in the following disclosure. In those instances, it should be understood that the numbered elements shown in FIGS. 2a-2e which are not described in detail below substantially correspond with their like-numbered counterparts illustrated in FIGS. 1a-1f, and described in the associated disclosure set forth above.

Furthermore, it should be understood that, unless otherwise specifically indicated, any relative positional or directional terms that may be used in the descriptions below—such as "upper," "lower," "above," "below," "over," "under," "top," "bottom," "vertical," "horizontal," and the like—should be construed in light of that term's normal and everyday meaning relative to the depiction of the components or elements in the referenced figures. For example, referring to the schematic cross-section of the semiconductor device depicted in FIG. 2a, it should be understood that the back side 200b of the semiconductor wafer 200 is positioned at or near the "bottom" or "lower" surface of the wafer 200, and the front side 200f is positioned at or near the "top" or "upper" surface. Similarly, it should also be understood that the substrate 201 is positioned "below" or "under" the device layer 202, and the hardmask layer 207 is positioned "above" or "over" the contact structure layer 204. Additionally, the term "vertical" should be understood as being substantially perpendicular to the front and/or back faces 200f, 200b of the wafer 200, whereas the term "horizontal" should understood as being substantially parallel to the front and/or back faces 200f, 200b.

Figure 1C:
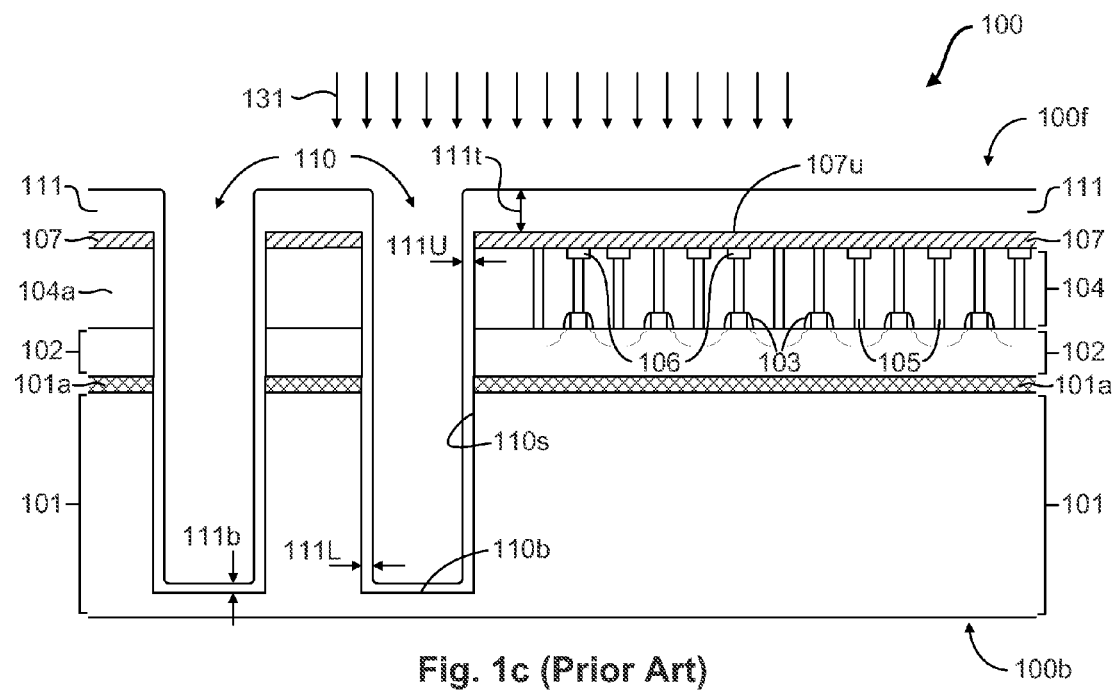
Figure 1D:
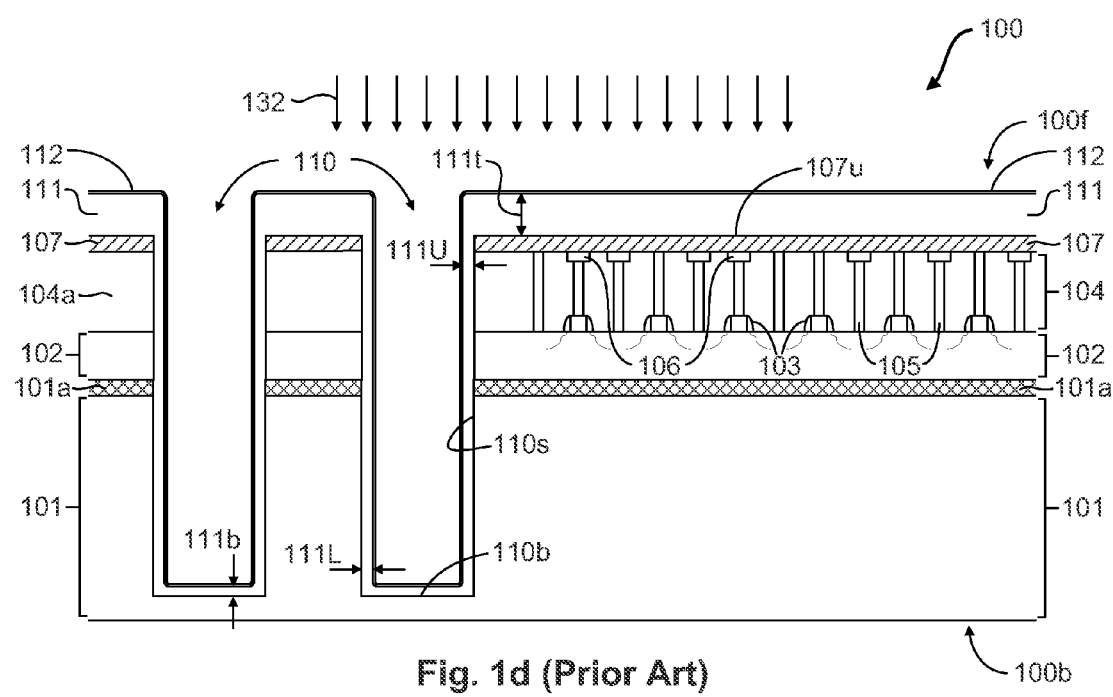
Figure 2A:
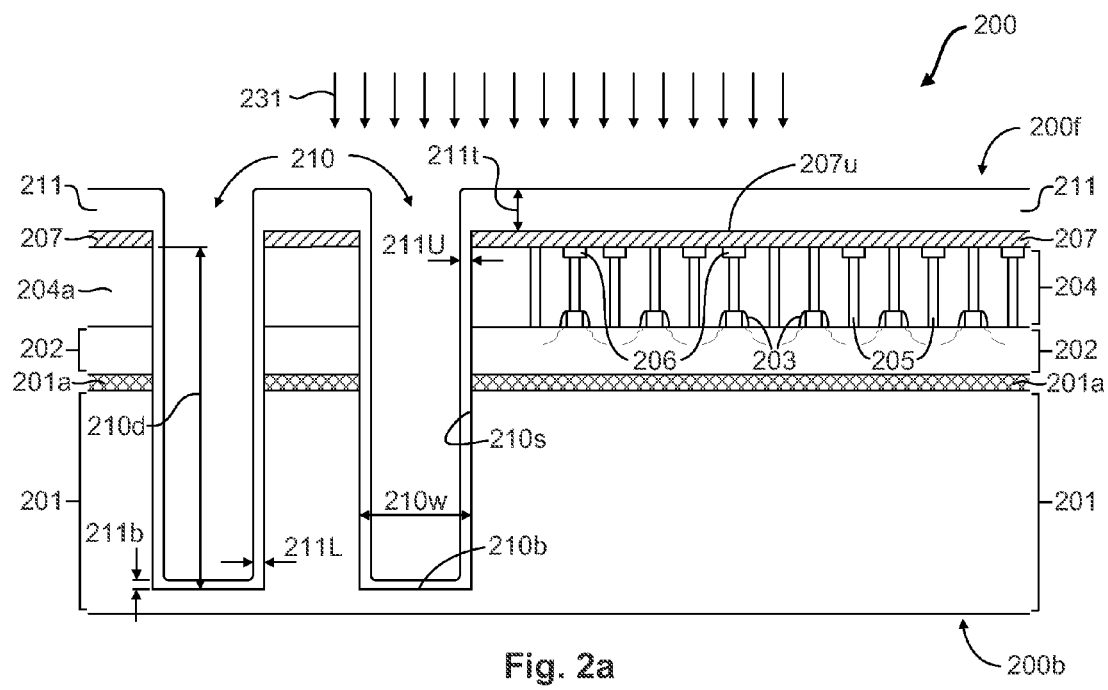
FIGS. 2a-2h schematically illustrate a process flow of an illustrative embodiment of forming TSV's in accordance with the subject matter disclosed herein.

FIG. 2a shows a schematic cross-sectional view of an illustrative semiconductor wafer 200 of the present disclosure that substantially corresponds to the wafer 100 illustrated in FIG. 1c as described above, wherein a patterned hardmask layer 207 has been formed above the wafer 200, and wherein TSV openings 210 having a total depth 210d have been formed through the contact structure layer 204, the device layer 202, the buried insulating layer 201a (if SOI architecture is used), and into the substrate 201. Additionally, FIG. 2a depicts a manufacturing stage wherein an isolation layer 211, comprising, for example, a suitable insulating dielectric material such as silicon dioxide and the like, may be formed above the wafer 200, including the inside surfaces 210s and 210b of the TSV openings 210. In some illustrative embodiments, the specific deposition process 231 used to form the isolation layer 211 may result in some degree of variation in one or more of the as-deposited material thicknesses 211t, 211U, 211L and 211b, depending on a variety of deposition parameters, such as process recipe, location and orientation of the deposition surface, and the like, as previously discussed with respect to FIG. 1c above.

Figure 2B:
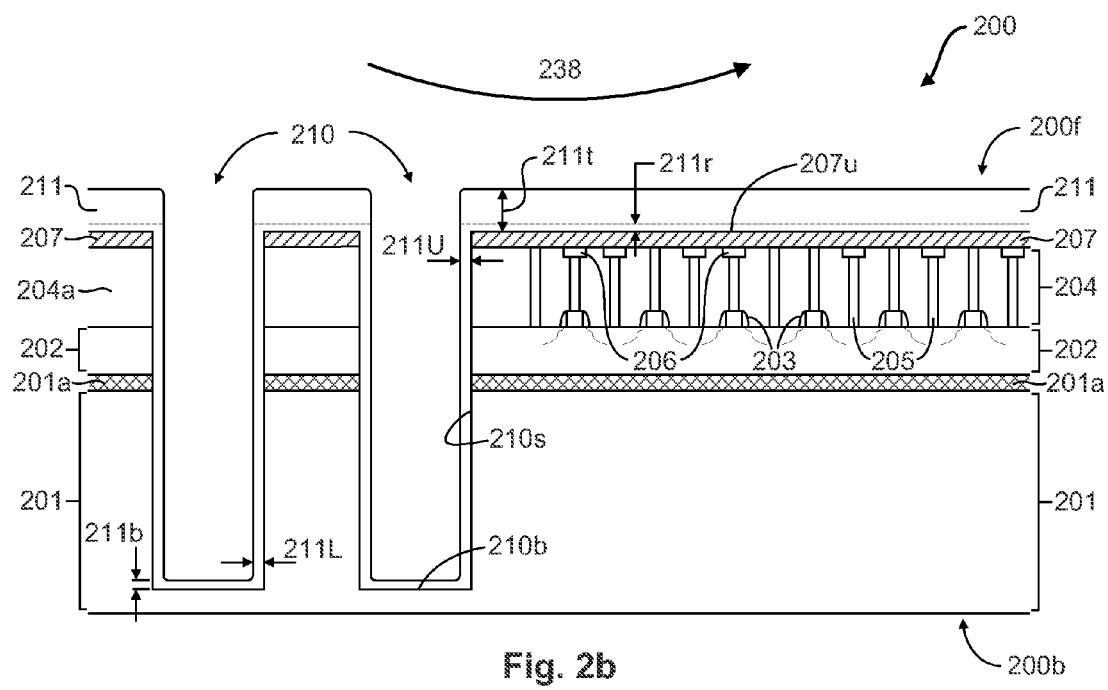

FIG. 2b shows the semiconductor wafer 200 of FIG. 2a in a further illustrative manufacturing stage, wherein the isolation layer 211 may be exposed to a first planarization process 238, such as, for example, a CMP process and the like. As noted with respect to the illustrative prior art planarization process 140 depicted in FIG. 1f and described above, processing difficulties may sometimes arise when the simultaneous planarization of multiple materials is undertaken, as the removal rates between the various materials may differ when exposed to the same CMP recipe, such as, for example, a CMP recipe utilizing a slurry chemistry that is selective the material of the barrier layer 212, and the like. Accordingly, in some embodiments of the present disclosure, the first planarization process 238 may be performed prior to forming a barrier layer and/or a layer of conductive contact material above the isolation layer 211. In this way, the CMP recipe used to perform the first planarization process 238 may be adjusted as required to meet only the targeted removal rate for the specific material comprising the isolation layer 211, such as silicon dioxide, because, in contrast to the prior art process depicted in FIG. 1f, other materials, such as copper, titanium, titanium nitride and the like, may not present during the first planarization process 238.

In certain illustrative embodiments, the first planarization process 238 may be performed until substantially all of the horizontal portion of the isolation layer 211 has been completely removed from above the upper surface 207u of the hardmask layer 207, thereby substantially eliminating the differential removal rate effects caused by the presence of multiple materials during subsequent planarizing processes, as previously described. However, in other illustrative embodiments, the first planarization process 238 may be stopped when a reduced residual thickness 211r of the isolation layer 211 remains above the hardmask layer 207, thereby substantially reducing the effects of the differential removal rate previously described. For example, in certain embodiments, the first planarization process 238 may be performed until the residual thickness 211r of the isolation layer 211 remaining above the upper surface 207u of the hardmask layer 207 is approximately 10-20 nm.

Depending on the overall processing strategy, control of the first planarization process 238 may be performed by any one of several methods well known in the art. For example, as described with respect to the prior art process above, in those illustrative embodiments of the present disclosure wherein the isolation layer 211 is substantially completely removed from above the upper surface 207u of the hardmask layer 207, the hardmask layer 207 may be used as a CMP stop indicator by detecting the presence of the material comprising the hardmask layer 207 during the planarizing operation. In other illustrative embodiments, the CMP processing time may be adjusted based upon one or more automated process control strategies, such as in situ measurements, feedback control data from previously processed wafers, and the like.

Figure 2C:
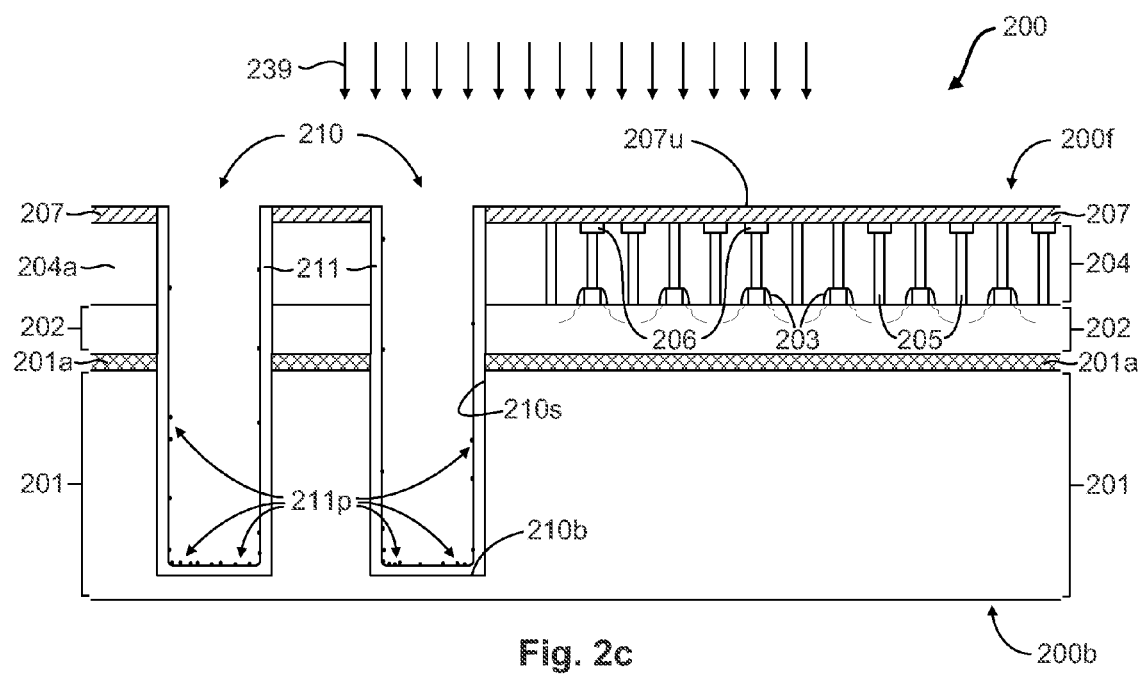

FIG. 2c shows the illustrative semiconductor wafer 200 of FIG. 2b in a further advanced stage of processing after completion of the first planarization process 238, wherein substantially all of the horizontal portion of the isolation layer 211 has been substantially removed from above the upper surface 207u of the hardmask layer 207. As shown in FIG. 2c, in certain illustrative embodiments, some residual particles 211p of the isolation layer 211 may be generated during the first planarization process 238. The residual particles 211p and may be present on or embedded in the surfaces of those portions of the isolation layer 211 which remain inside of the TSV openings 210. As may be well understood by those skilled in the art, the presence of the residual particles 211p may lead to defects in material layers that may be subsequently formed on the remaining portions of the isolation layer 211, such as barrier layers, conductive contact material layers, and the like. Accordingly, in some embodiments of the subject matter disclosed herein, a cleaning process 239 may be performed as shown in FIG. 2c to remove the residual particles 211p. In certain illustrative embodiments, the cleaning process 239 may be chemical cleaning process, such as, for example, exposing the surfaces of the isolation layer 211 to a diluted hydrofluoric acid treatment, and the like. Other suitably designed cleaning recipes well known to those skilled in the art may also be used.

Figure 2D:
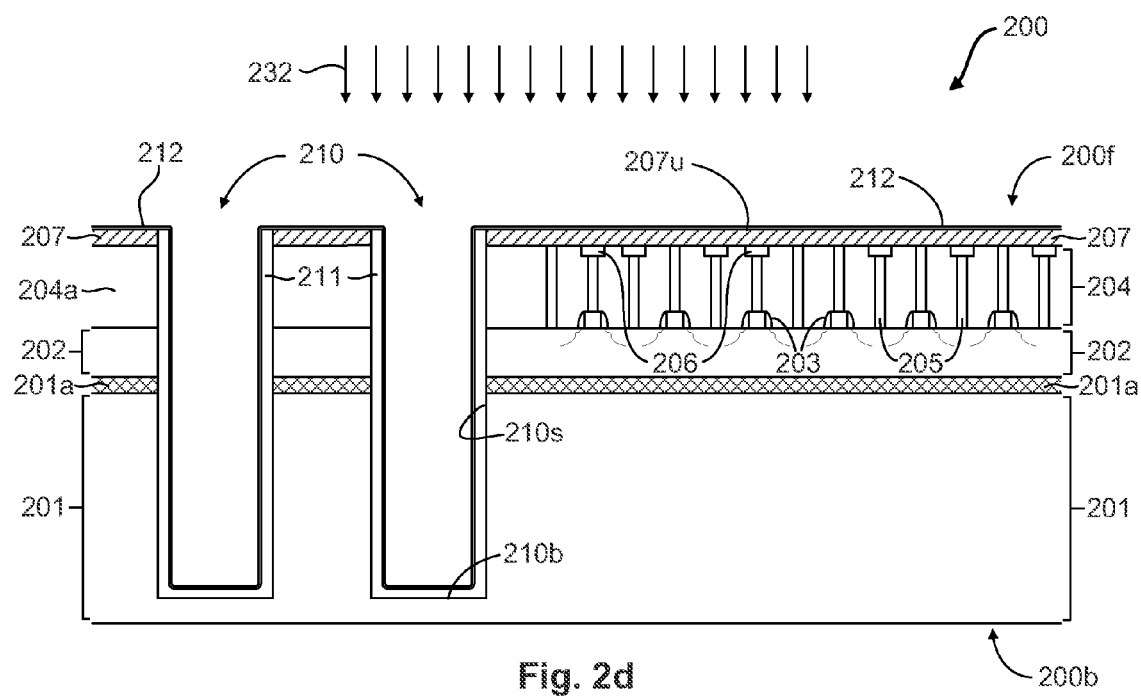

FIG. 2d illustrates the semiconductor wafer 200 of FIG. 2c in another stage of manufacture, after completion of the cleaning process 239 described above. As depicted in the illustrative embodiment shown in FIG. 2d, a barrier layer 212 may be formed above the wafer 200, which may, in certain embodiments, serve to prevent the conductive material comprising the finished TSV's 220 (see FIG. 2g) from diffusing into and/or through the isolation layer 211, or diffusing into and/or through the interlayer dielectric (ILD) layer 204a. Furthermore, the barrier layer 212 may also act as an adhesion layer, thereby potentially enhancing that overall bond between the contact material of the finished TSV's 220 and the underlying dielectric isolation layer 211.

As shown in FIG. 2d, in some illustrative embodiments the barrier layer 212 may be formed above the wafer 200 using, for example, a deposition process 232, so as to cover all exposed surfaces of those portions of the isolation layer 211 remaining inside of the TSV openings 210, as well as the upper surface 207u of the hardmask layer 207. It should be noted that in certain illustrative embodiments wherein a residual thickness 211r of the isolation layer 211 may remain above the upper surface 207u after completion of the first planarization process 238, the barrier layer 212 may be formed so as to cover the residual material of the isolation layer 211 remaining above the hardmask layer 207. In some embodiments of the present disclosure, the materials comprising, the methods used for forming, and the thicknesses of the barrier layer 212 may be substantially as those described with respect to the barrier layer 112 of the prior art process illustrated in FIG. 1d.

Figure 1E:
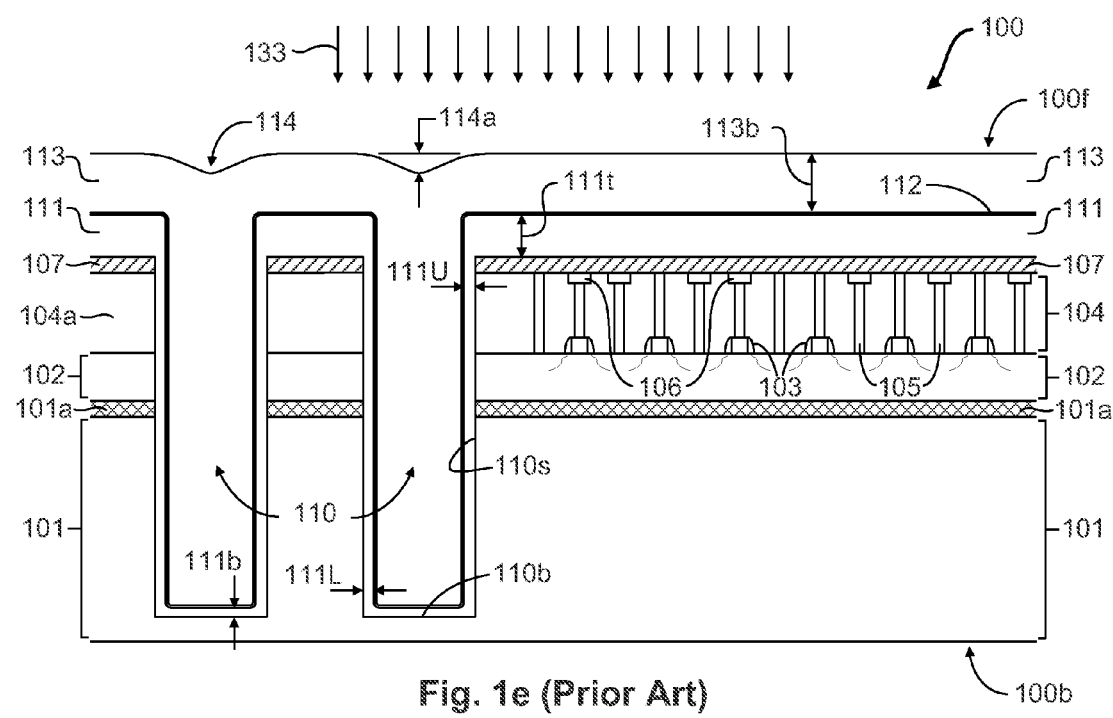
Figure 1F:
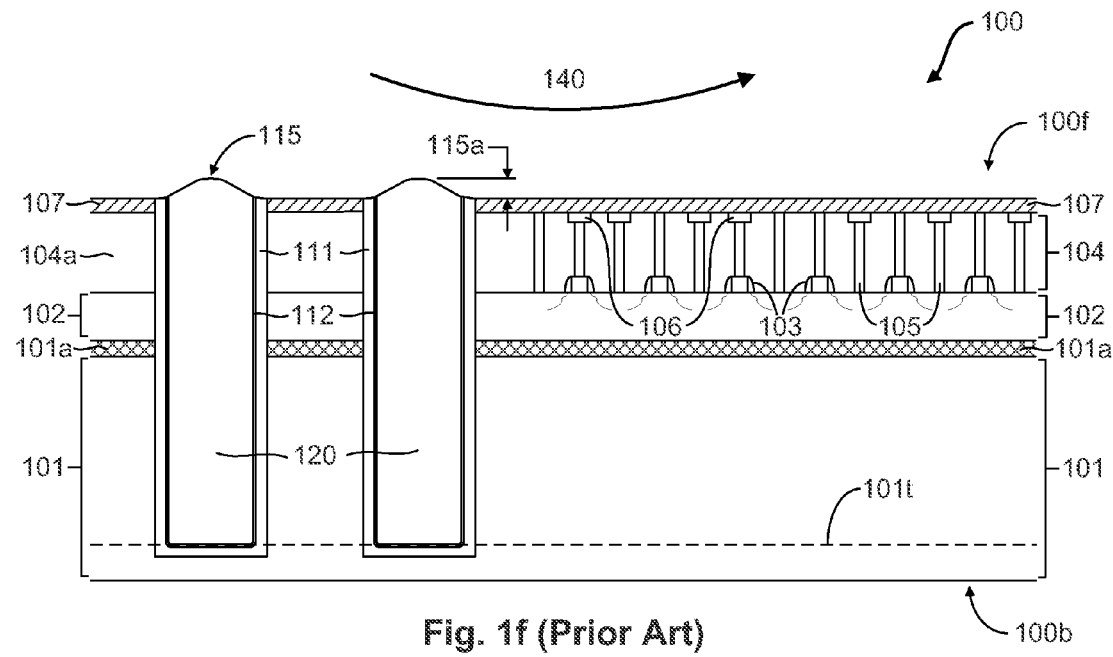
Figure 2E:
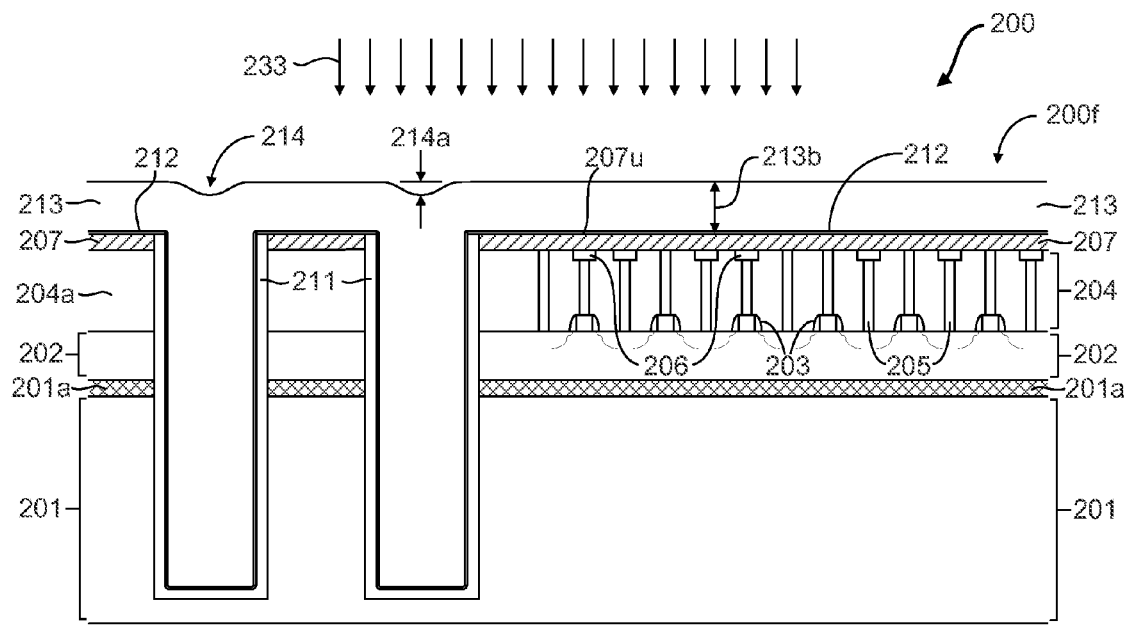

FIG. 2e shows the illustrative semiconductor wafer 200 in yet a further manufacturing stage, after the isolation layer 211 has been planarized and the barrier layer 212 has been formed above the planarized isolation layer 211 and above the upper surface 207u of the hardmask layer 207. As illustrated in FIG. 2e, a layer of conductive contact material 213 may be formed above the wafer 200 so as to completely fill the TSV openings 210. Depending on the TSV design requirements, the layer of conductive contact material 213 may be substantially comprised of a conductive metal, such as copper and the like, or in certain embodiments may comprise a suitable copper metal alloy. In some embodiments, the TSV openings 210 may be filled with the layer of conductive contact material 213 based on a substantially "bottom-up" deposition process 233 well known to those skilled in the art, such as a suitably designed electrochemical plating (ECP) process and the like, thereby reducing the likelihood that voids may be formed and/or trapped in the finished TSV's 220 (see FIG. 2g). In other illustrative embodiments, an electroless plating process may be employed. Additionally, and depending on the type of material used for the barrier layer 212 and the type of deposition process 233 used to fill the TSV openings 210, a seed layer (not shown) may be formed on the barrier layer 212 prior to performing the deposition process 233. The thickness of, and methods used for forming, the seed layer may be as previously outlined with respect to the prior art method illustrated in FIG. 1e and described above.

It should be noted that, as a result of the "bottom-up" deposition process 233 used to fill the TSV openings 210, depressions 214 may be present in the layer of conductive contact material 213 above each of the TSV openings 210 after completion of the deposition process 233, similar to the prior art process shown in FIG. 1e. As such, at least some amount of material "overburden" 213b may need to be deposited outside of the TSV openings 210 and above the upper horizontal surfaces 200s of the wafer 200 to ensure that the TSV openings 210 are completely filled with the layer of conductive contact material 213. In some embodiments, and depending on the width 210w, depth 210d, and aspect ratio of the TSV openings 210, the thickness of the overburden 213b may be greater than 2 nm. Moreover, the overburden 213b may range as high as 4-5 μm, or even greater, in order to ensure that the depth 214a of the depressions 214 in the conductive contact material layer 213 does not encroach into the TSV openings 210.

Figure 2F:
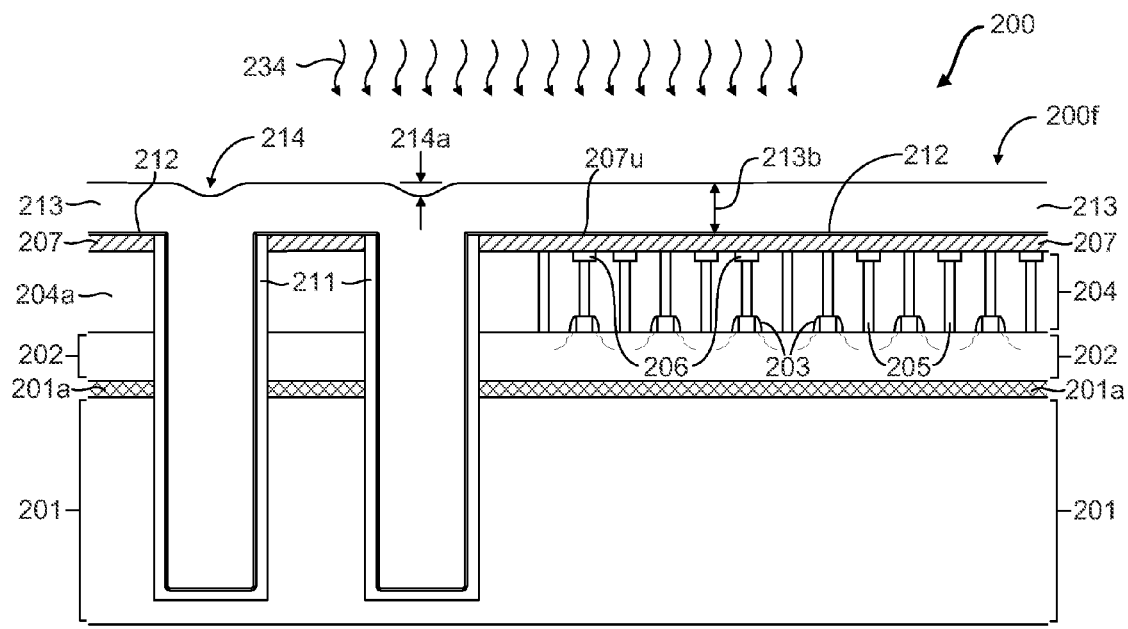

FIG. 2f depicts the illustrative semiconductor wafer of FIG. 2e after completion of the deposition process 233 used to fill the TSV openings 210 with the layer of conductive contact material 213. As shown in FIG. 2f, in those process recipes wherein the layer of conductive contact material 213 comprises an electroplated copper and/or copper alloy, the wafer 200 may be exposed to a heat treatment process 234 after the layer of conductive contact material 213 has been formed, thereby facilitating grain growth and stabilization of the copper film characteristics. In certain illustrative embodiments, the heat treatment process 234 may comprise an annealing process performed under atmospheric pressure conditions for a time of 1 hour or less, wherein the temperature range of the annealing process may be from 100°-300° C. Other heat treatment recipes may also be used, depending on the overall integration scheme and thermal budget of the wafer 200.

Figure 2G:
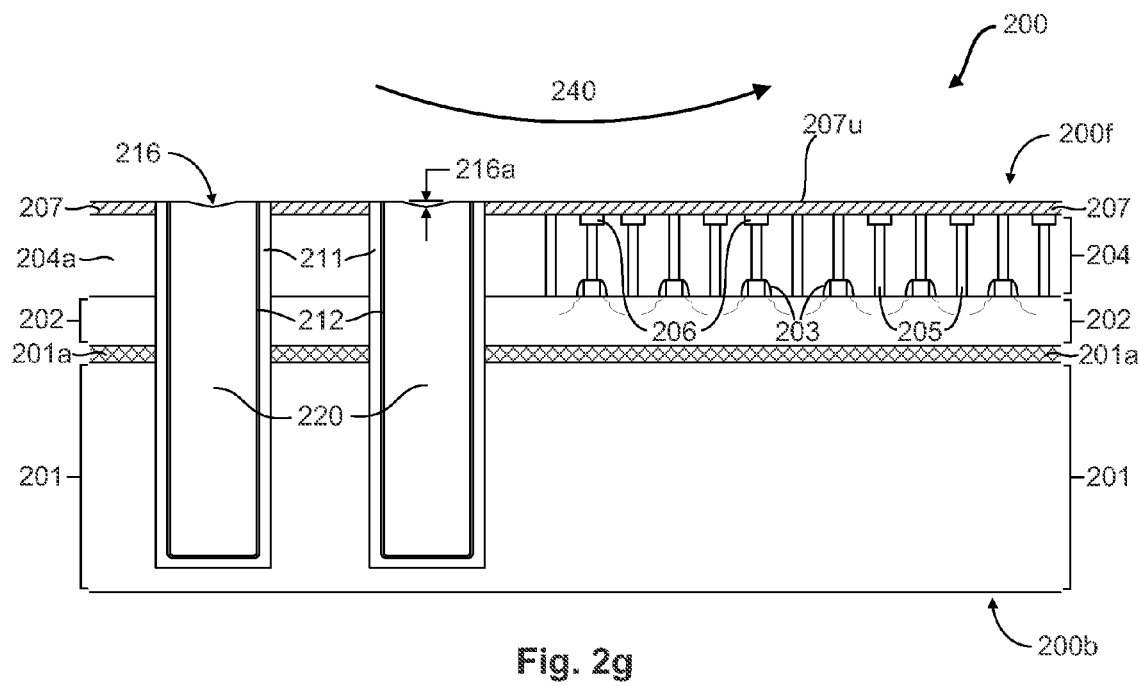

FIG. 2g shows the illustrative wafer 200 of FIG. 2f in a still further advanced manufacturing stage. As shown in FIG. 2g, a second planarization process 240, such as a CMP process and the like, may be performed to remove the horizontal portions of the material layers formed outside of the TSV openings 210 from above the horizontal upper surface 207u of the hardmask layer 207. More specifically, in the illustrative embodiment shown in FIG. 2g, the recipe used for the planarization process 240 may be adapted to substantially completely remove the horizontal portions of the layer of conductive contact material 213 and the barrier layer 212 from above the hardmask layer 207. For example, since the horizontal portions of the isolation layer 211 may have been substantially completely removed from above the upper surface 207u of the hardmask layer 207 during the previously performed first planarization process 238 (see FIG. 2b), the previously-described differential removal rate effects may be less significant. Accordingly, the parameters used for the second planarization process 240—such as, for example, a slurry chemistry that is selective to the conductive contact material 213, and the like—may be adjusted for a more aggressive material removal rate, thereby shortening the duration of the second planarization process 240 and resulting in an overall reduction of device processing time.

Control of the second planarization process 240 may be performed by any one of the methods previously described regarding the first planarization process 238, such as, for example, using the hardmask layer 207 as a CMP stop layer, in situ measurements, feedback control, and the like. Moreover, depending on the control method and process strategy used, the thickness of the hardmask layer 207 may be reduced to some degree during the second planarization process 240.

It should be noted that, since the horizontal portions of the isolation layer 211 may not be present above the upper surface 207u of the hardmask layer 207 during the second planarization process 240, the problematic effects described above that may be associated with differential material removal rates during CMP processing may be substantially minimized, if not eliminated altogether. Moreover, even in those illustrative embodiments of the present disclosure wherein a residual horizontal thickness 211r of the isolation layer 211 may still be present during the second planarization process 240, the detrimental effects of the differential material removal rates may still be significantly reduced, as the residual thickness 211r (see FIG. 2b) may be substantially reduced as compared to the as-deposited thickness 211t of the isolation layer 211. Accordingly, in some illustrative embodiments, the presence of a protruding region above the finished TSV's 220 (see, e.g., protruding region 115 of FIG. 1f) may be substantially eliminated, thereby resulting in a substantially planar upper surface above the finished TSV's 220.

In other illustrative embodiments, some amount of CMP "dishing" may occur as a result of employing aggressive CMP parameters during the second planarization process 240, which may cause the presence of the any depressions 214 (see FIG. 2e) in the as-deposited layer of conductive contact material 213 to translate into a dished region 216 having a depth 216a at the upper end of each finished TSV 220 after completion of the second planarization process 240. However, in accordance with various illustrative embodiments disclosed herein, these type of "dishing" effects may be mitigated in some respects for at least the following reasons: since the isolation layer 211 may be substantially or even completely removed from above the upper surface 207u of the hardmask layer 207 prior to forming the layer of conductive contact material 213, the CMP parameters used during the second planarization process 240 may be adjusted only as required to handle the planarization characteristics of the material comprising the layer of conductive contact material 213. Accordingly, the depth 216a of the dished regions 216 may be substantially reduced, or even eliminated. For example, in some illustrative embodiments, the depth 216a may be less than approximately 100 nm, and in certain embodiments may be as little as 50 nm, or even less. Moreover, due at least in part to the reduced depth 216a, the likelihood that the presence of the dished regions 216 in the finished TSV's 220 may translate into additional defects in subsequently formed metallization layers may also be substantially reduced.

In some illustrative embodiments of the present disclosure, the depth 216a of the dished regions 216 may be significantly reduced by adjusting the residual thickness 211r of the isolation layer 211 that may above the hardmask layer 207 after the first planarization process 238 (see, FIG. 2b). Thereafter, during a later stage of the second planarization process 240, the slurry chemistry may be adjusted so as to be more selective to the material of the barrier layer 212 as previously described. The removal rate of the remaining portions of the conductive contact material 213 may therefore be significantly lower than that of the residual thickness 211r of the isolation layer 211 and the barrier layer 212. Accordingly, when the residual thickness 211r and the slurry chemistry used during the later stages of the second planarization process 240 are properly adjusted and balanced, good planarization of the finished TSV's 220 may be obtained, such that the depth 216a of the dished regions 216 may be reduced or even eliminated altogether.

Figure 2H:
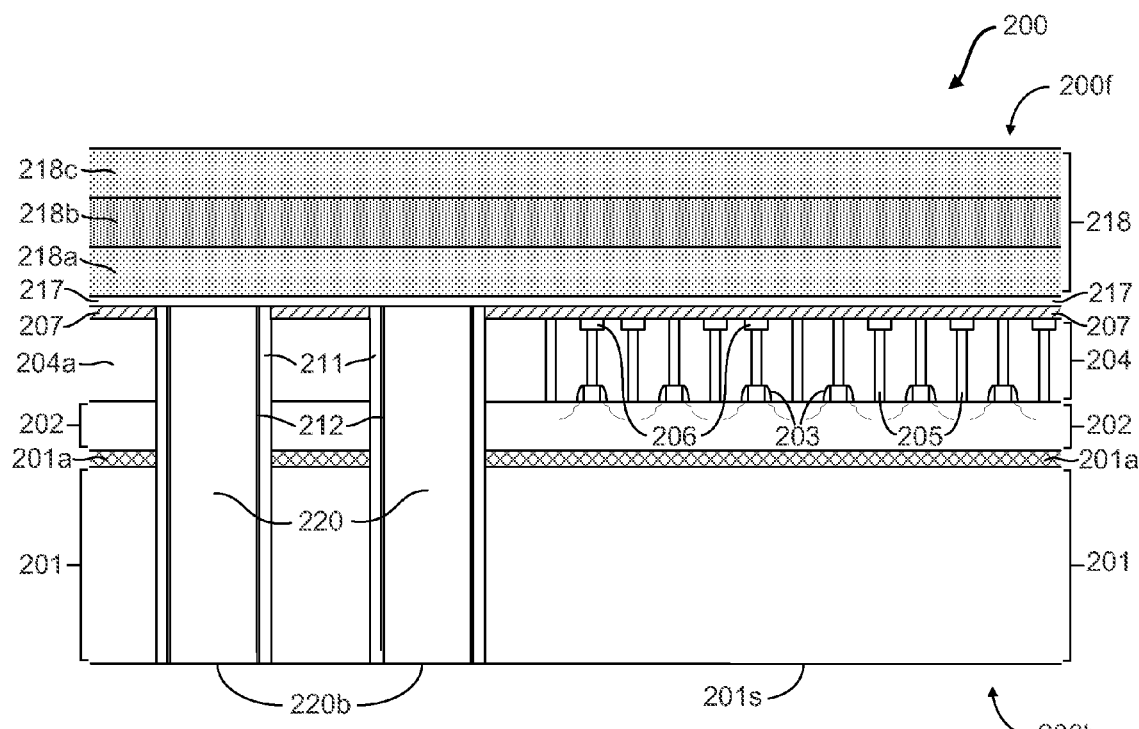

FIG. 2h depicts the illustrative wafer 200 of FIG. 2g in yet another advanced manufacture stage. After completion of the second planarization process 240, additional processing of the front side 200f of the wafer 200 may be performed. For example, as shown in FIG. 2h, a metallization system 218 comprising a plurality of metallization layers 218a, 218b, 218c, etc. may be formed above the finished TSV's 220 and the contact structure layer 204 so as to provide electrical interconnects between the circuit elements 203 and circuit elements present on any one of a plurality of additional stacked semiconductor chips that may eventually be bonded and electrically connected to the wafer 200. Additionally, in some illustrative embodiments, an etch stop layer 217 may also be formed above the hardmask layer 207 and the finished TSV's, so as to also facilitate the formation of interconnect structures between the metallization system and the finished TSV's 220. The etch stop layer 217 may comprise any one of a number of dielectric materials that may be suitably selective to an etch process used to form contact via openings and/or trenches in the interlayer dielectric material of the first metallization layer 218a. For example, depending on the material comprising the interlayer dielectric layer of the first metallization layer 218a, the material of the etch layer may comprise silicon nitride, silicon oxide, silicon oxynitride and the like. Furthermore, the wafer 200 may be thinned from the back side 200b so as to reduce the thickness of the substrate 201 (indicated in FIG. 2e by surface 201s) and thereby expose the bottom surfaces 220b of the hybrid TSV's 220 in preparation for wafer stacking and substrate bonding—i.e., 3D integrated circuit assembly. This back-side thinning operation may be accomplished by performing one or more of a grinding, etching, and/or polishing process so as to provide a thinned substrate 201 having a predetermined thickness, wherein the predetermined thickness may, in certain illustrative embodiments, depend on the eventual purpose or application for which the wafer 200 may be used in an overall stacked chip design.

As a result, the subject matter disclosed herein provides various methods of planarizing through-silicon vias (TSV's). While these techniques may be of particular advantage for TSV's having a width of 10 μm or more and a depth of 50 μm or more, these techniques may be successfully employed for TSV openings having significantly smaller dimensions. Moreover, while some of the embodiments described above are directed to TSV's comprising silicon dioxide isolation layers and copper and/or copper alloy conductive contact materials, the methods disclosed herein may also be applicable to other suitably designed material combinations, depending on the overall device design and processing requirements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a layer of isolation material above a via opening formed in a semiconductor device, said via opening extending into a substrate of said semiconductor device;
    performing a first planarization process to remove at least an upper portion of said layer of isolation material formed outside of said via opening; and
    after performing said first planarization process, forming a layer of conductive material above said substrate to cover at least a remaining portion of said isolation layer, and thereafter forming a conductive via element inside of said via opening from said layer of conductive material.

2. The method of claim 1, wherein performing said first planarization process comprises performing a chemical-mechanical polishing process.

3. The method of claim 2, further comprising performing a cleaning process prior to forming said conductive via element, wherein said cleaning process is adapted to remove particles created during said first planarization process.

4. The method of claim 1, wherein forming said layer of isolation material comprises forming said layer of isolation material above a bottom surface of said via opening, adjacent to sidewall surfaces of said via opening, and above an upper surface of an interlayer dielectric layer formed above said substrate.

5. The method of claim 1, wherein forming said layer of isolation material comprises depositing a dielectric material layer comprising silicon dioxide.

6. The method of claim 1, wherein forming said conductive via element comprises performing a second planarization process to remove at least a portion of said layer of conductive material formed outside of said via opening.

7. The method of claim 6, wherein performing said second planarization process comprises performing a chemical-mechanical polishing process.

8. The method of claim 1, wherein forming said layer of conductive material comprises performing an electrochemical deposition process to deposit a metal layer comprising copper.

9. The method of claim 1, further comprising forming a barrier layer to cover at least said layer of isolation material prior to forming said conductive via element.

10. The method of claim 9, further comprising forming said barrier layer after performing said first planarization process.

11. The method of claim 9, wherein forming said barrier layer comprises depositing a conductive material comprising at least one of tantalum, tantalum nitride, titanium and titanium nitride.

12. A method, comprising:
    forming a hardmask layer above a contact structure layer formed above a device layer of a substrate;
    forming an opening that extends through said hardmask layer, said contact structure layer and said device layer, and into said substrate;
    forming a layer of isolation material inside of said opening and above said hardmask layer;
    performing a first chemical-mechanical polishing process to remove at least an upper portion of said layer of isolation material formed above said hardmask layer; and
    after performing said first chemical-mechanical polishing process, forming a layer of conductive contact material to fill said opening.

13. The method of claim 12, further comprising performing a cleaning process prior to forming said layer of conductive contact material, wherein said cleaning process is adapted to remove particles created during said first chemical-mechanical polishing process.

14. The method of claim 12, further comprising performing a second chemical-mechanical polishing process after forming said layer of conductive contact material to expose said hardmask layer.

15. The method of claim 12, wherein forming said layer of isolation material comprises forming a dielectric material layer comprising silicon dioxide.

16. The method of claim 12, wherein forming said layer of conductive contact material comprises performing an electrochemical deposition process to form a metal layer comprising copper.

17. The method of claim 12, further comprising forming a conductive barrier layer above said layer of isolation material prior to forming said layer of conductive contact material.

18. The method of claim 17, wherein forming said conductive barrier layer comprises depositing a material layer comprising at least one of tantalum, tantalum nitride, titanium and titanium nitride.

19. The method of claim 12, wherein performing said first chemical-mechanical polishing process comprises exposing said hardmask layer.

20. The method of claim 14, further comprising forming one or more metallization layers above said contact structure layer after performing said second chemical-mechanical polishing process.

21. The method of claim 20, further comprising forming an etch stop layer above said device layer prior to forming said one or more metallization layers.

22. The method of claim 12, wherein forming said layer of isolation material comprises forming said layer of isolation material having at least a first thickness inside of said opening and at least a second thickness different than said first thickness above said hardmask layer.

23. The method of claim 22, wherein said second thickness is at least two times greater than said first thickness.

24. The method of claim 22, wherein said second thickness is at least four times greater than said first thickness.

* * * * *